(12) United States Patent  
Kobayashi et al.

(10) Patent No.: US 9,082,823 B2  
(45) Date of Patent: Jul. 14, 2015

(54) SEMICONDUCTOR DEVICE AND METHOD OF MANUFACTURING THE SAME

(71) Applicant: Sony Corporation, Tokyo (JP)

(72) Inventors: Shoji Kobayashi, Kanagawa (JP); Yuki Yanagisawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/185,195

(22) Filed: Feb. 20, 2014

(65) Prior Publication Data

US 2014/0239441 A1 Aug. 28, 2014

(30) Foreign Application Priority Data

Feb. 27, 2013 (JP) ................. 2013-037316

(51) Int. Cl.  
*H01L 23/525* (2006.01)  
*H01L 21/768* (2006.01)  
*H01L 27/10* (2006.01)

(52) U.S. Cl.  
CPC ........ *H01L 21/76838* (2013.01); *H01L 27/101* (2013.01); *H01L 23/5252* (2013.01); *H01L 2924/0002* (2013.01)

(58) Field of Classification Search  
CPC .............. H01L 23/525; H01L 23/5252; H01L 23/5256; H01L 21/76838; H01L 22/22; H01L 27/11206  
USPC ........................................ 257/529; 438/601  
See application file for complete search history.

(56) References Cited

U.S. PATENT DOCUMENTS

2013/0058150 A1* 3/2013 Hidaka et al. ................. 365/96

FOREIGN PATENT DOCUMENTS

JP 2012-174863 9/2012

* cited by examiner

*Primary Examiner* — Selim Ahmed  
(74) *Attorney, Agent, or Firm* — Sony Corporation

(57) ABSTRACT

A semiconductor device, includes: a first semiconductor layer having a first conductivity type; a pair of first electrodes arranged to be separated from each other in the first semiconductor layer; a second electrode provided on the first semiconductor layer between the pair of first electrodes with a dielectric film in between; and a pair of connection sections electrically connected to the pair of first electrodes, wherein one or both of the pair of first electrodes are divided into a first region and a second region, the first region and the second region being connected by a bridge section.

9 Claims, 12 Drawing Sheets

SEMICONDUCTOR DEVICE AND METHOD OF MANUFACTURING THE SAME

CROSS REFERENCE TO RELATED APPLICATIONS

This application claims the benefit of Japanese Priority Patent Application JP 2013-37316 filed on Feb. 27, 2013, the entire contents of which are incorporated herein by reference.

BACKGROUND

The present disclosure relates to a semiconductor device suitable for a memory element such as an OTP (One Time Programmable) element and to a method of manufacturing the semiconductor device.

The OTP element is a nonvolatile memory element capable of storing information even when an electric power source of a device is turned off. In the past, several structures such as a fuse-type structure and an anti-fuse-type structure have been proposed for the OTP element.

In the fuse-type OTP element, a resistor is fused by flowing a large current to a resistive element formed of, for example, polysilicon or the like to change short-circuit state between both electrodes to open state therebetween, and thereby, an information writing operation is performed. However, in the fuse-type OTP element, since a large current is flown at the time of writing as described above, a transistor having a high current ability capable of flowing a large current and a wiring having a large width capable of flowing a large current therein are necessitated. Therefore, in the fuse-type OTP element, there has been a disadvantage that the whole area including a peripheral circuit is increased.

In contrast, in the anti-fuse-type OTP element, an alloy (such as silicide) formed in an electrode section is melted by applying a voltage equal to or larger than a dielectric strength voltage to, for example, an MOS (Metal Oxide Semiconductor)-type capacitive element, breaking down a dielectric film, and flowing a large current. The melted metal forms a filament between electrodes, and thereby, open state between both the electrodes is changed to short-circuit state therebetween. Thereby, an information writing operation is performed (for example, see Japanese Unexamined Patent Application Publication No. 2012-174863). In the anti-fuse-type OTP element, at the time of writing, a large current is not necessitated as much as in the fuse-type OTP element. Therefore, the anti-fuse-type OTP element is advantageous in terms of the area, and electric power consumption is allowed to be suppressed.

SUMMARY

However, in order to form the filament, a certain level of a large current (such as from about several mA to about 100 mA both inclusive) is necessitated. Therefore, there has been a possibility that burnout occurs at contact sections with respect to the electrodes and a wiring section located ahead by heat generated at the time of forming the filament. Examples of a method to avoid the burnout may include departing the contact sections and the wiring section from a region where high heat is generated. However, in this case, the electrode sections are concurrently enlarged, and therefore, the area of the element section is increased. Further, in the case where the electrode sections are enlarged, a heat-release effect is increased. Therefore, heat necessary for forming the filament is less likely to be generated, leading to increased electric power consumption and increased writing time.

It is desirable to provide a semiconductor device capable of decreasing its area while preventing burnout of contact sections and a method of manufacturing the semiconductor device.

According to an embodiment of the present technology, there is provided a semiconductor device, including: a first semiconductor layer having a first conductivity type; a pair of first electrodes arranged to be separated from each other in the first semiconductor layer; a second electrode provided on the first semiconductor layer between the pair of first electrodes with a dielectric film in between; and a pair of connection sections electrically connected to the pair of first electrodes, wherein one or both of the pair of first electrodes are divided into a first region and a second region, the first region and the second region being connected by a bridge section.

According to an embodiment of the present technology, there is provided a method of manufacturing a semiconductor device, the method including: forming a pair of first electrodes in a first semiconductor layer having first conductive-type, one or both of the pair of first electrodes being divided into a first region and a second region; forming a dielectric film on the first semiconductor layer between the pair of first electrodes; forming a second electrode arranged on the dielectric film; forming a bride section electrically connecting the first region and the second region; and forming a pair of connection sections connected to the pair of first electrodes.

In the semiconductor device and the method of manufacturing the semiconductor device of the above-described embodiments of the present technology, one or both of the pair of first electrodes are divided into the first region and the second region, the bridge section electrically connecting the first region and the second region is provided, and thereby, at the time of writing, heat generated between the pair of first electrodes is confined, and heat conduction to the connection section connected to the second region is allowed to be suppressed.

According to the semiconductor device and the method of manufacturing the semiconductor device of the above-described embodiments of the present technology, one or both of the pair of first electrodes are divided into a heat confinement region (the first region) at the time of writing and a connection region with respect to the connection section (the second region). Thereby, heat necessary for writing, that is, forming an electrically-conductive path is prevented from being dispersed, and heat conduction to a joint section between the connection region and the connection section is suppressed. Therefore, the area is allowed to be reduced while burnout of the joint section is prevented.

It is to be understood that both the foregoing general description and the following detailed description are exemplary, and are intended to provide further explanation of the technology as claimed.

BRIEF DESCRIPTION OF THE DRAWINGS

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

A description will be given in detail below of some embodiments of the present technology with reference to the drawings. It is to be noted that the description will be given in the following order.

Figure 1A:
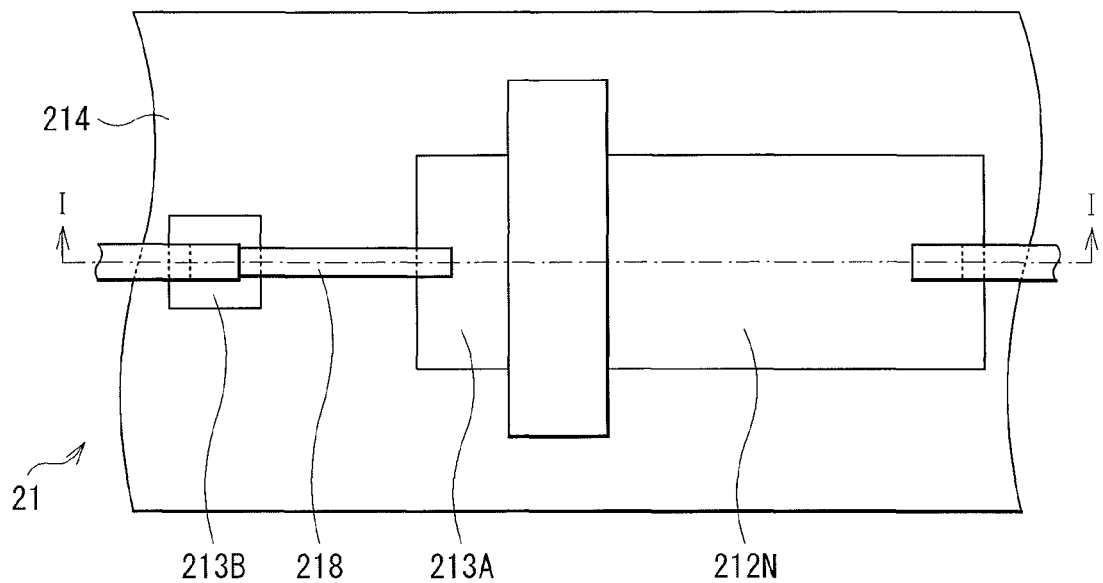
FIG. 1A is a plan view illustrating a configuration of a memory element configuring a semiconductor device (memory device) according to a first embodiment of the present disclosure.
Figure 1B:
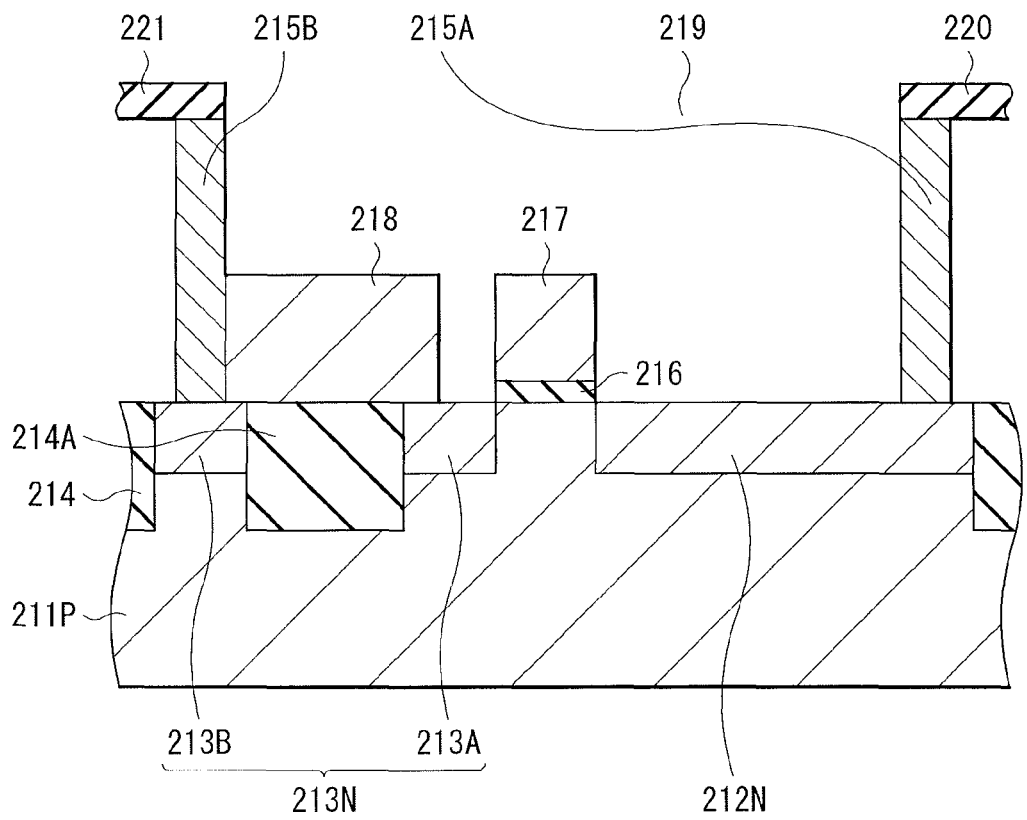
FIG. 1B is a cross-sectional view of the memory element illustrated in FIG. 1A.

1. First Embodiment (an MOS transistor structure: an example in which a bridge section between a first region and a second region is formed of an electrically-conductive film)
  1-1. Basic Configuration
  1-2. Configuration of Memory Device
  1-3. Manufacturing Method
  1-4. Function and Effect
2. Second Embodiment (an example in which a shared contact is used for a bridge section)
3. Third Embodiment (an example in which a bridge section is formed in an insulating film)
4. Modifications (examples of source-drain-type memory elements)
  Modification 1
  Modification 2
  Modification 3
  Other Modifications 1. First Embodiment 1-1. Basic Configuration FIG. 1A illustrates a planar configuration of a semiconductor element (a memory element 21) configuring a semiconductor device (a memory device 1) according to a first embodiment of the present disclosure. FIG. 1B illustrates a configuration of a cross-section taken along a line I-I of the memory element 21 illustrated in FIG. 1A. The memory element 21 is an element in which information is stored by a writing operation. Although described in detail later, the memory element 21 is a so-called anti-fuse-type OTP element. The memory element 21 in this embodiment has an MOS-type transistor structure, and has a semiconductor layer 212N and a semiconductor layer 213N (a pair of first electrodes) that correspond to a source electrode and a drain electrode, respectively. In this example, the semiconductor layer 213N (a drain electrode) is divided into a heat confinement region 213A (a first region) and a connection region 213B (a second region). The heat confinement region 213A and the connection region 213B are electrically connected by an electrically-conductive film 218.

A semiconductor layer 211P (a first semiconductor layer) may configure, for example, a semiconductor substrate, and may be, for example, a P-type (first conductive-type) semiconductor layer. The semiconductor layer 211P may be made, for example, of a semiconductor material in which, for example, silicon (Si) or the like is doped with an impurity such as boron (B). Further, examples of the material forming the semiconductor layer 211P are not limited thereto, and for example, an SOI (Silicon On Insulator) substrate may be used.

The semiconductor layer 212N and the semiconductor layer 213N correspond to a source electrode and a drain electrode, respectively, and are arranged to be separated from each other with a predetermined space in between in the semiconductor layer 211P. Each of the semiconductor layer 212N and the semiconductor layer 213N may be, for example, an N-type (second conductive-type) semiconductor layer (configuring a so-called N+layer). Each of the semiconductor layers 212N and 213N may be made of a semiconductor material in which, for example, Si or the like is doped with an impurity such as arsenic (As) and phosphorus (P). Each of the thicknesses of the semiconductor layer 212N and the semiconductor layer 213N may be, for example, from about 50 nm to about 200 nm both inclusive. The semiconductor layers 212N and 213N are allowed to be easily formed by a self-aligning method or a method using a mask pattern with the use of a predetermined photoresist, an oxide film, and the like in the region of the semiconductor layer 211P. A distance between the semiconductor layer 212N and the semiconductor layer 213N may be desirably as small as possible (such as from about 50 nm to about 200 nm both inclusive), since thereby, the memory element 21 having a small element size is achievable.

The semiconductor layer 213N (corresponding to a drain electrode) in this embodiment is divided into the heat confinement region 213A (the first region) and the connection region 213B (the second region) with an element separation film 214 (an insulating film 214A) in between. The heat confinement region 213A and the connection region 213B are electrically connected by the after-described electrically-conductive film 218.

The element separation film 214 integrated with the insulating film 214A is arranged inside the semiconductor layer 211P, and faces the top surface of the semiconductor layer 211P. The element separation film 214 is arranged in the periphery of the semiconductor layer 212N and the semiconductor layer 213N other than the space between the semiconductor layer 212N and the semiconductor layer 213N. The element separation film 214 prevents diffusion of heat generated between the semiconductor layers 212N and 213N that produce heat by application of a voltage (to the semiconductor layer 213N, in particular, to the heat confinement region 213A). Further, the element separation film 214 insulates the heat confinement region 213A from the connection region 213B, and thereby, protects a joint section between the connection region 213B and an after-described contact section 215B and the like from burnout. Examples of a material of the element separation film 214 may include a common insulating material such as silicon oxide ($SiO_2$) and silicon nitride ($SiN_x$). The thickness thereof may be, for example, from about 100 nm to about 800 nm both inclusive.

A dielectric film 216 is provided in a region (in this example, a region between the semiconductor layers 212N and 213N and partial regions in the semiconductor layers 212N and 213N) corresponding to the space between the semiconductor layers 212N and 213N that is located on the semiconductor layer 211P. The dielectric film 216 may be made, for example, of an insulating material (a dielectric material) similar to that of a common gate insulating film in an MOS transistor such as $SiO_2$, and the thickness thereof may be, for example, from about several nm to about 20 nm both inclusive.

An electrically-conductive film 217 corresponds to a gate electrode. The electrically-conductive film 217 is provided on a region where the dielectric film 216 is formed, and thereby, a laminated structure configured of the dielectric film 216 as a lower layer and the electrically-conductive film 217 as an upper layer is formed. The electrically-conductive film 218 is provided in a region (in this example, a region between the heat confinement region 213A and the connection region 213B and partial regions in the heat confinement region 213A and the connection region 213B) corresponding to the space between the heat confinement region 213A and the connection region 213B, and the heat confinement region 213A and the connection region 213B are electrically connected by the electrically-conductive film 218. The electrically-conductive films 217 and 218 may be made, for example, of a conductive material such as polycrystal silicon and a silicide metal, and each of the thicknesses thereof may be, for example, from about 50 nm to about 500 nm both inclusive. Alternatively, the electrically-conductive film 218 may be formed of a metal material such as titanium nitride (TiN) and nickel silicide ($NiSi_2$).

An insulating layer 219 is provided to cover the semiconductor layers 212N and 213N and the electrically-conductive films 217 and 218. The insulating layer 219 may be made, for example, of an insulating material such as $SiO_2$ and $SiN_x$, and the thickness thereof may be, for example, from about 50 nm to about 2000 nm both inclusive.

Each of contact sections 215A and 215B (a pair of connection sections) may be made, for example, of a conductive material such as a metal such as tungsten (W) and aluminum (Al). The contact section 215A is provided on the semiconductor layer 212N and inside the element separation film 214 so that the semiconductor layer 212N is electrically connected to a wiring layer 220. The contact section 215B is provided on the connection region 213B of the semiconductor layer 213N and inside the element separation film 214 so that the connection region 213B is electrically connected to a wiring layer 221.

Figure 2A:
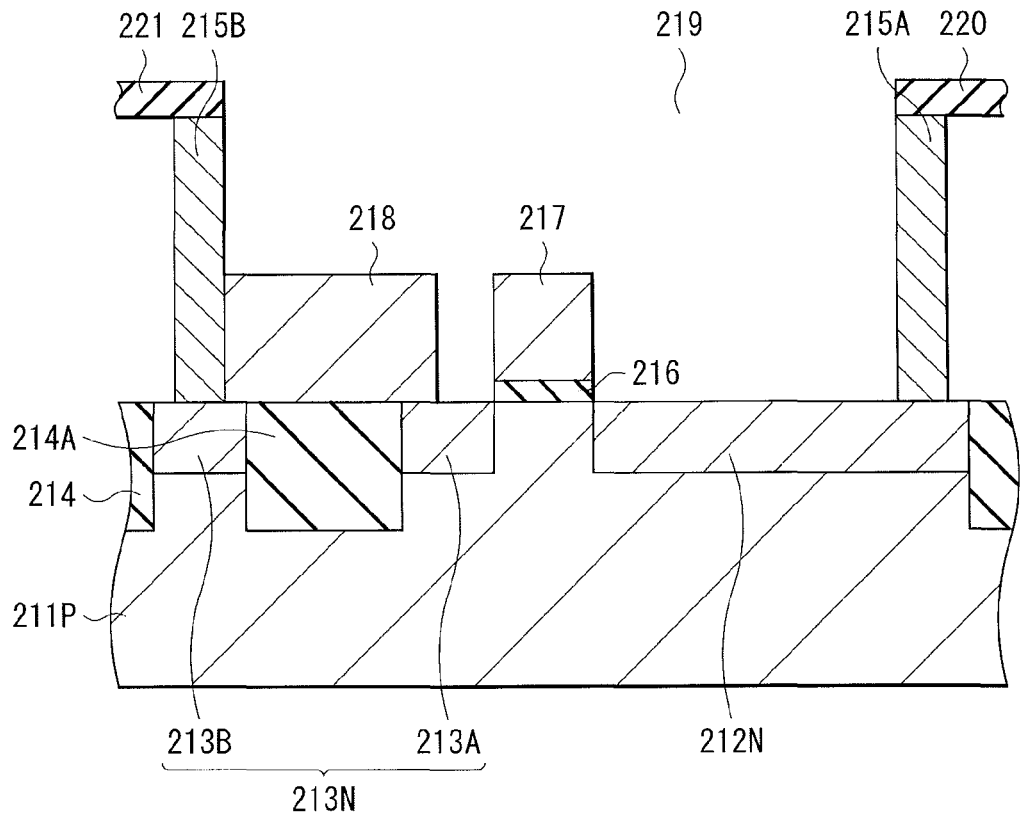
FIG. 2A is a schematic view illustrating a configuration of the memory element illustrated in FIG. 1A before a writing operation.
Figure 2B:
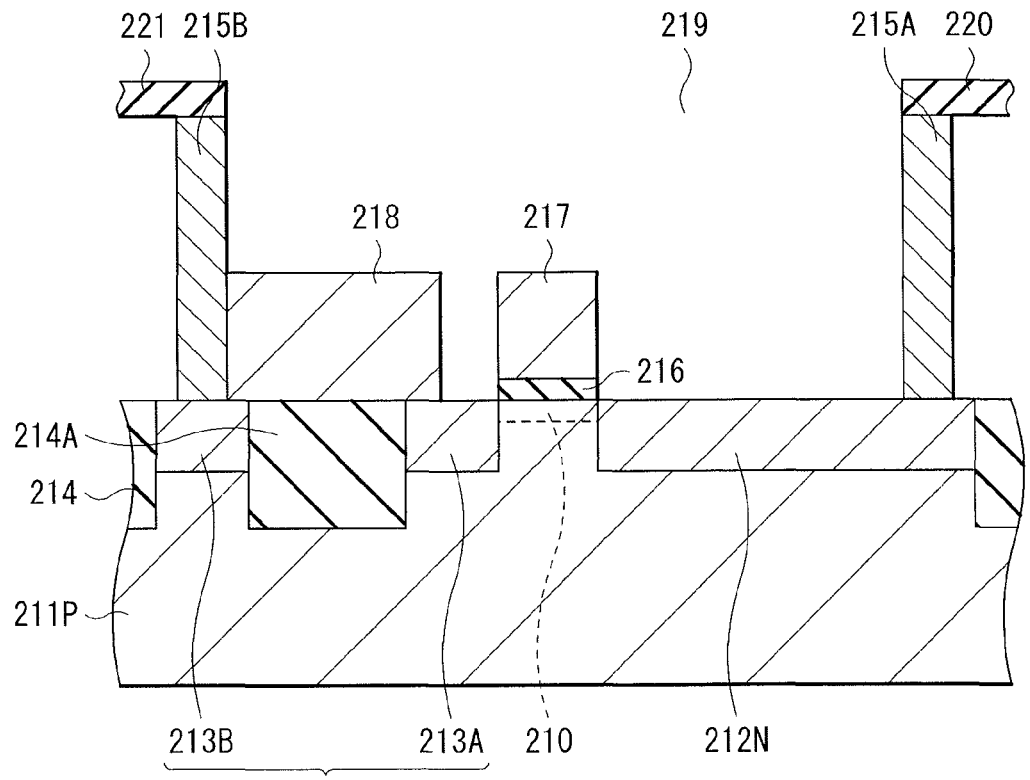
FIG. 2B is a schematic view illustrating a configuration of the memory element illustrated in FIG. 1A after the writing operation.

FIG. 2A illustrates a cross-sectional configuration of the memory element 21 before a writing operation, and FIG. 2B illustrates a cross-sectional configuration of the memory element 21 after the writing operation. As illustrated in FIG. 2A, the memory element 21 before the writing operation has the semiconductor layers 211P, 212N, and 213N (213A and 213B); the contact sections 215A and 215B; the element separation film 214; the insulating layer 219; the dielectric film 216; and the electrically-conductive films 217 and 218.

In contrast, as illustrated in FIG. 2B, in the memory element 21 after the writing operation, an after-described filament 210 (an electrically-conductive path section) is formed in addition to the semiconductor layers 211P, 212N, and 213N (213A and 213B); the contact sections 215A and 215B; the element separation film 214; the insulating layer 219; the dielectric film 216; and the electrically-conductive films 217 and 218 that are described above.

The filament 210 is formed in the region between the semiconductor layer 212N and the semiconductor layer 213N through the semiconductor layer 211P, and serves as an electrically-conductive path that electrically connects the semiconductor layers 212N and 213N. In other words, in the memory element 21 illustrated in FIG. 2B, the semiconductor layers 212N and 213N are short-circuited (in a short-circuit state) based on a predetermined resistance value (by a resistance component) by the filament 210. Such a filament 210 is formed as follows. When a voltage V1 equal to or larger than a predetermined threshold value is applied between the heat confinement region 213A of the semiconductor layer 213N and the electrically-conducive film 217, conductor components configuring, for example, the electrode 213A, the contact section 215A, and the electric conductor 218; and a silicide alloy that is applied to the electrode 213A are moved by migration, and thereby, the filament 210 is formed.

The filament 210 may be formed on the following principle. That is, first, when the foregoing voltage V1 is applied between the heat confinement region 213A of the semiconductor layer 213N and the electrically-conducive film 217 of the memory element 21, insulation breakdown occurs in part or all of the dielectric film 216. Accordingly, a current suddenly flows between the electrically-conducive film 217 and the semiconductor layer 213N. The insulation breakdown of the dielectric film 216 occurs mainly on the semiconductor layer 213N side where the electric field intensity is relatively high. However, since the interface state, the film thickness, and the shape of the dielectric film 216 are not perfectly uniform, the insulation breakdown of the dielectric film 216 does not occur uniformly as a whole, but occurs in a local region where the insulation breakdown voltage is relatively low. Therefore, at the time of the insulation breakdown of the dielectric film 216, the foregoing current flows locally, leading to large current density, large heat generation, and major damage in semiconductor crystal (such as silicon crystal) in a region below the dielectric film 216 in the semiconductor layer 211P. Being affected by increased temperature in the vicinity due to the heat generation, a current instantaneously flows between the semiconductor layers 212N and 213N due to an electrical potential difference therebetween based on a leak path caused by the foregoing damage as a starting point, and junctional disruption occurs. Heat resulting from the current flowing at this time causes migration, which results in movement of one or both of the conductor components configuring the electrode 213A and the contact section 215B and the conductor component configuring the contact section 215A into the semiconductor layer 211P. As a result, the filament 210 may be formed.

As described above, in the memory element 21 on which the foregoing writing operation is not performed yet (information is not written yet) of the memory device 1 according to this embodiment, as illustrated in FIG. 2A, the semiconductor layers 212N and 213N are electrically separated (an open state). In contrast, in the memory element 21 on which the foregoing writing operation has been performed (information has been written), as illustrated in FIG. 2B, since the filament 210 is formed, the semiconductor layers 212N and 213N are in a state of being electrically connected (a short-circuit state) by the resistance component. Further, in the memory element 21 after the writing operation, as described above, insulation breakdown occurs in part or all of the dielectric film 216. Accordingly, the memory element 21 is allowed to serve as an anti-fuse-type OTP element.

It is to be noted that in the "open state" before the foregoing writing operation, a minute leak current flows in reality, and therefore, the "open state" does not refer to a perfect open state technically. However, since a current flowing between the semiconductor layers 212N and 213N before the wiring operation (before formation of the filament 210) largely differs from a current flowing between the semiconductor layers 212N and 213N after the wiring operation (after the formation of the filament 210), states before and after such a writing operation are allowed to be differentiated and detected.

1-2. Configuration of Memory Device

Figure 3:
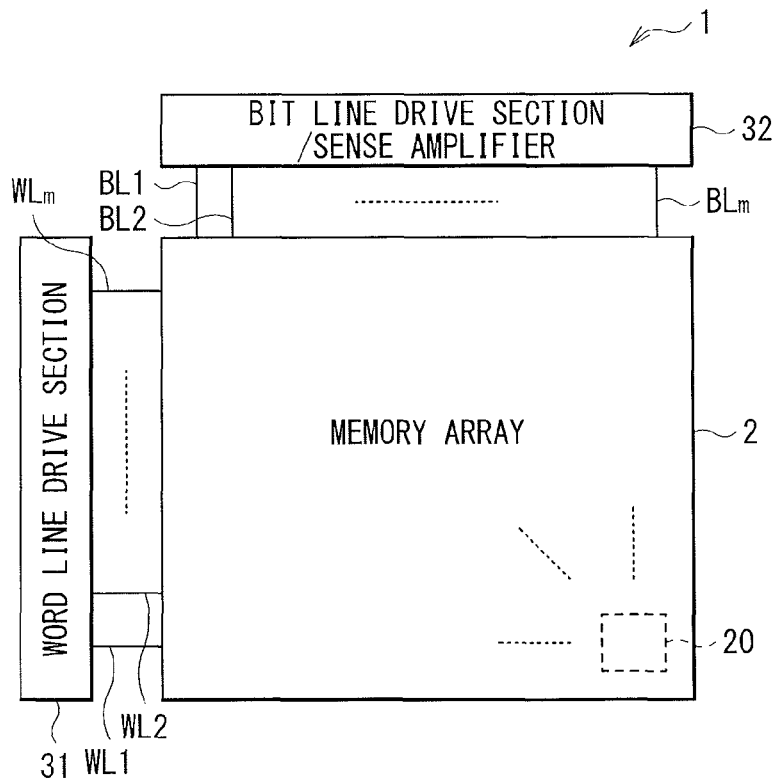
FIG. 3 is a block diagram illustrating a configuration example of the memory device illustrated in FIG. 1A.

FIG. 3 illustrates a block configuration of the memory device 1 according to this embodiment. The memory device 1 is a memory device (a so-called OTP ROM (Read Only Memory)) in which, as described above, information (data) is allowed to be written only once, the written information is allowed to be read many times, and the information is not allowed to be erased. The memory device 1 includes a memory array 2 having a plurality of memory elements 21 (memory cells 20), a word line drive section 31, and a bit line drive section/sense amplifier 32. Of the forgoing, the word line drive section 31 and the bit line drive section/sense amplifier 32 correspond to drive sections (a writing operation section and a programming operation section).

The word line drive section 31 applies a predetermined electric potential (an after-described word line electric potential) to each of a plurality of (in this example, m (m: one of integer numbers equal to or larger than 2) pieces of) word lines WL1 to WLm that are arranged in parallel fashion in a line direction.

The bit line drive section/sense amplifier 32 applies a predetermined electric potential (an after-described writing operation-use voltage) to each of a plurality of (in this example, m pieces of) bit lines BL1 to BLm that are arranged in parallel fashion in a column direction. Thereby, the predetermined voltage V1 is applied to each of the after-described memory elements 21 in the memory cells 20, and the after-described information writing operation is performed. Further, the bit line drive section/sense amplifier 32 performs an operation of reading information from the respective memory cells 20 with the use of the foregoing m pieces of bit lines BL1 to BLm, and has a function to perform predetermined signal amplification processing in the internal sense amplifier. It is to be noted that, on the following description, as a collective term of the bit lines BL1 to BLm, "bit line BL" will be used as appropriate.

As described above, the word line drive section 31 and the bit line drive section/sense amplifier 32 select one of the memory cells 20 to become a drive target (an operation target) from the plurality of memory cells 20 in the memory array 2, and selectively performs the information writing operation or the information reading operation.

Figure 4:
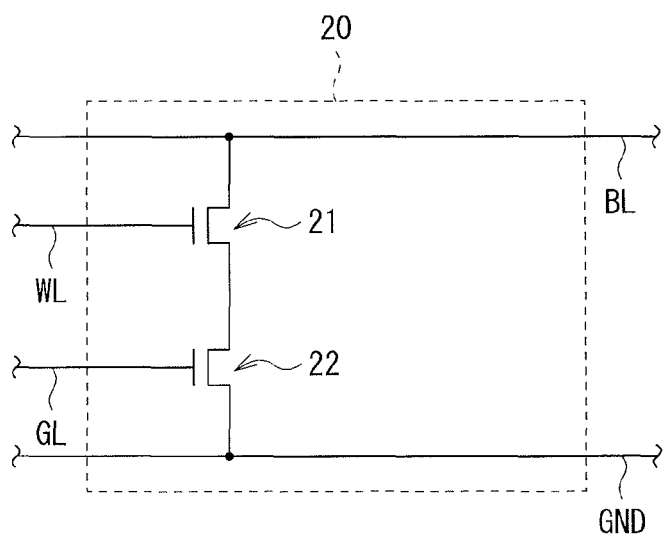
FIG. 4 is a circuit diagram illustrating a configuration example of a memory cell illustrated in FIG. 3.

In the memory array 2, for example, as illustrated in FIG. 3, the plurality of memory cells 20 may be arranged in a line-column state (a matrix state). FIG. 4 illustrates an example of a circuit configuration of the memory array 2. In the memory array 2, one word line WL and one bit line BL are connected to each of the memory cells 20.

Further, each of the memory cells 20 has one memory element 21 and one selective transistor 22, and has a so-called "1T1R"-type circuit configuration. In each of the memory cells 20, one word line WL is connected to a gate of one selective transistor 22. One bit line BL is connected to one of the source and the drain of each of the memory elements 21, and the after-described contact section 215B (in this example, a drain electrode) in one selective transistor 22 is connected to the other one of the source and the drain of each of the memory devices 21. Further, the after-described contact section 215A (in this example, a source electrode) in one selective transistor 22 is connected to ground GND. An electric potential of the contact section 217 (the gate electrode) is set to a predetermined electric potential (a gate electric potential Vg). That is, in each of the memory cells 20, one memory element 21 and one selective transistor 22 are connected in series between one bit line BL and the ground GND.

The selective transistor 22 is a transistor used to select one of the memory elements 21 to become a drive target (a writing operation target or a reading operation target), and may be configured, for example, of an MOS (Metal Oxide Semiconductor) transistor. However, the selective transistor 22 is not necessarily configured thereof, and a transistor having other structure may be used as the selective transistor 22.

1-3. Manufacturing Method

A description will be given below of a method of manufacturing the memory element 21 referring to FIG. 5A to FIG. 5F. It is to be noted that, the structure of the memory element 21 illustrated in FIG. 1A is allowed to be easily formed by a method similar to that of steps of forming a general MOS transistor (such as steps of forming an self-aligning source and drain with the use of a gate of an MOS transistor as a mask). In this case, a distance between the semiconductor layers 212N and 213N that are separated from each other is allowed to be decreased, and dimensions are favorably controllable.

Figure 5A:
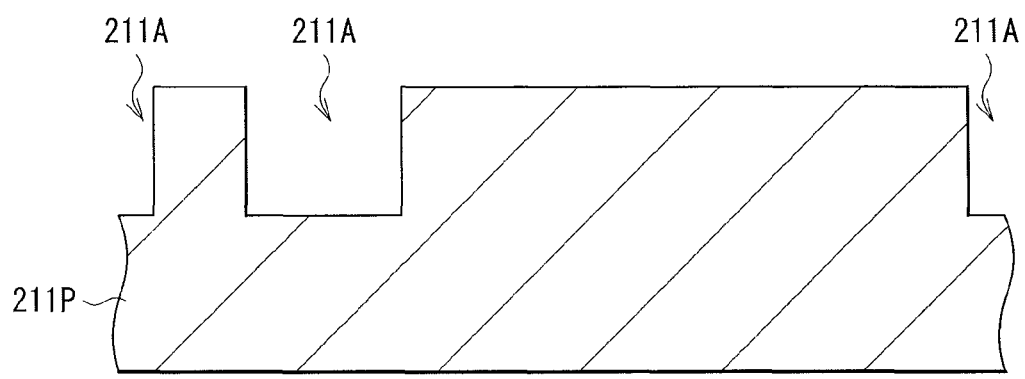
FIG. 5A is a cross-sectional view illustrating a method of manufacturing the memory element illustrated in FIG. 1A in order of steps.
Figure 5B:
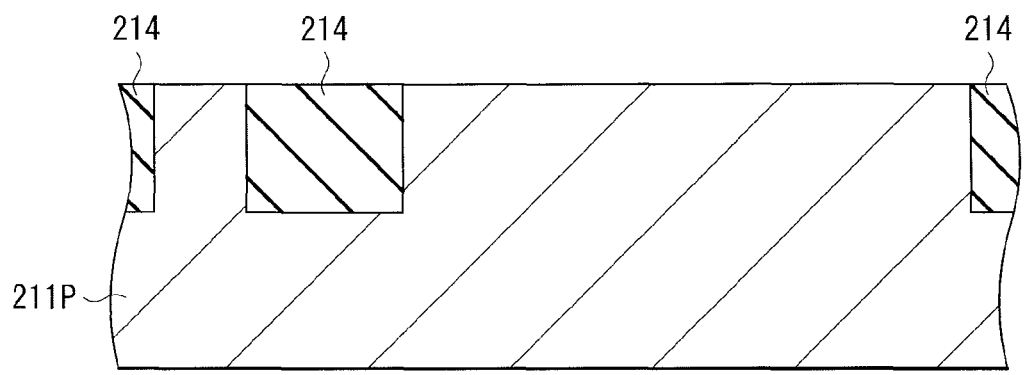
FIG. 5B is a cross-sectional view illustrating a step following a step of FIG. 5A.
Figure 5C:
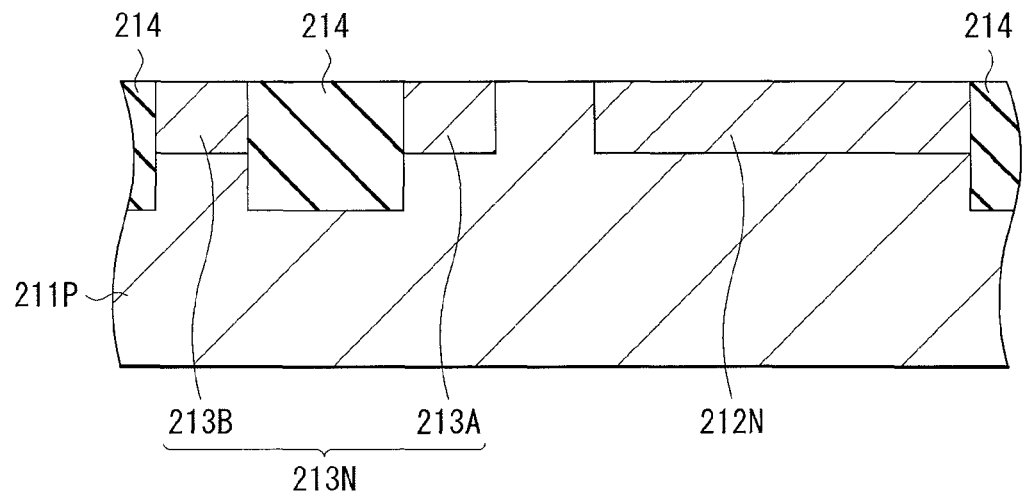
FIG. 5C is a cross-sectional view illustrating a step following the step of FIG. 5B.

Specifically, first, as illustrated in FIG. 5A, a concave section 211A for arranging the element separation film 214 in the semiconductor layer 211P may be formed, for example, by etching. Subsequently, as illustrated in FIG. 5B, for example, $SiO_2$ may be buried into the concave section 211A to arrange the element separation film 214. Thereafter, as illustrated in FIG. 5C, an impurity is injected with the use of an ion irradiation apparatus, and thereby, the semiconductor layers 212N and 213N are formed in predetermined regions.

Figure 5D:
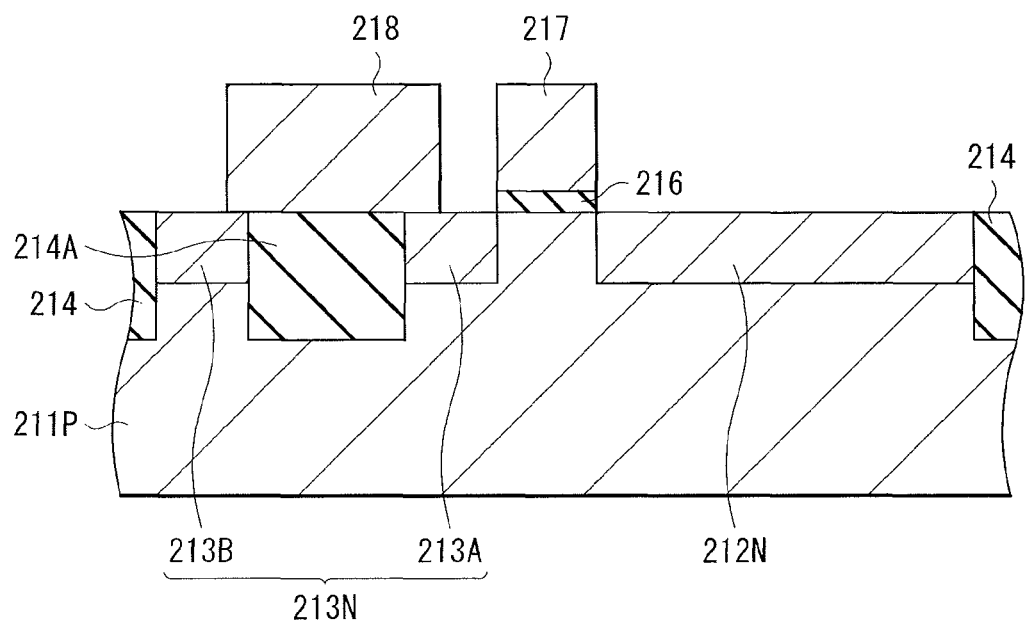
FIG. 5D is a cross-sectional view illustrating a step following the step of FIG. 5C.

Next, as illustrated in FIG. 5D, the whole surface of the semiconductor layer 211P in which the element separation film 214 and the semiconductor layers 212N and 213N are formed is coated with a dielectric film. Thereafter, portions of the dielectric film other than a predetermined region may be removed by etching or the like to form the dielectric film 216. Subsequently, an electrically-conductive film is formed on the semiconductor layer 211P and the dielectric film 216 by, for example, sputtering or the like, and thereafter, the electrically-conductive film may be processed by, for example, etching or the like to form the electrically-conductive films 217 and 218.

Figure 5E:
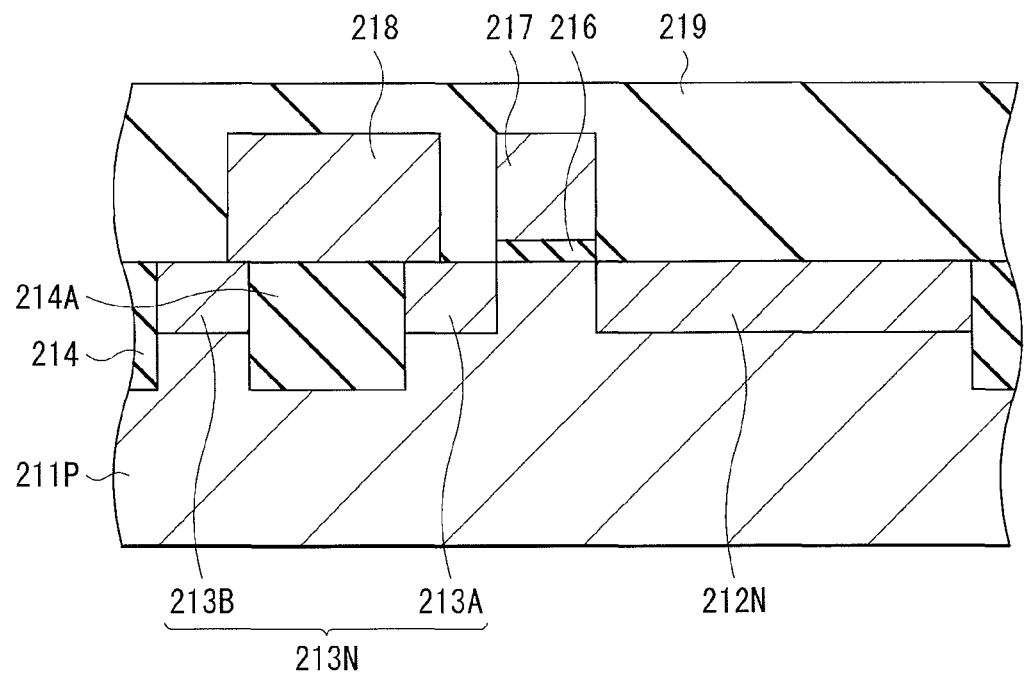
FIG. 5E is a cross-sectional view illustrating a step following the step of FIG. 5D.
Figure 5F:
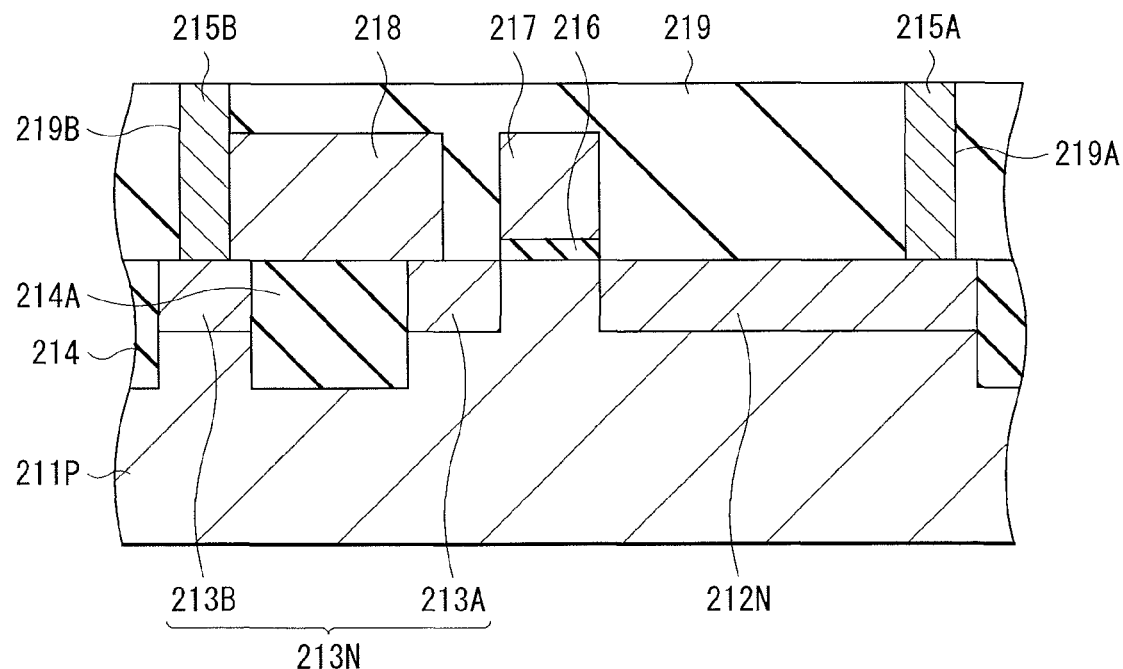
FIG. 5F is a cross-sectional view illustrating a step following the step of FIG. 5E.

Next, as illustrated in FIG. 5E, the whole surfaces of the semiconductor layer 211P and the electrically-conductive films 217 and 218 are coated with the insulating layer 219. Thereafter, as illustrated in FIG. 5F, through holes 219A and 219B are formed in predetermined positions. Finally, a metal material such as W may be filled into the through holes 219A and 219B, and thereafter, the wiring layers 220 and 221 made of, for example, Al may be formed on the insulating layer 219. Accordingly, the memory element 21 illustrated in FIGS. 1A and 1B is completed.

1-4. Function and Effect

In the memory device 1, as illustrated in FIG. 3 and FIG. 4, the word line drive section 31 applies the predetermined electric potential (the word line electric potential) to each of the m pieces of word lines WL1 to WLm. Further, concurrently, the bit line drive section/sense amplifier 32 applies the predetermined electric potential (the writing operation-use voltage) to each of the m pieces of bit lines BL1 to BLm. Thereby, one of the memory cells 20 to become a drive target (a writing operation target) is selected from the plurality of memory cells 20 in the memory array 2, the after-described predetermined voltage V1 is applied to the memory element 21 in such a selected memory cell 20, and thereby, the information writing operation (only once) is selectively performed.

In contrast, the bit line drive section/sense amplifier 32 performs the operation of reading information from one of the memory elements 21 in one of the memory cells 20 as a drive target (a reading operation target) with the use of the m pieces of bit lines BL1 to BLm, and performs predetermined signal amplification processing in the internal sense amplifier. Thereby, the operation of reading information from one of the memory elements 21 is selectively performed.

Upon selecting one of the memory cells 20 (the memory elements 21) as a drive target (a writing operation target or a reading operation target), the predetermined electric potential (the word line electric potential) is applied to the word line WL connected to such a selected memory cell 20, and the predetermined electric potential (the writing operation-use voltage) is applied to the bit line BL connected to such a selected memory cell 20. In each of drive-nontarget memory cells 20, a ground electric potential (such as 0V) is applied to each of word lines WL connected thereto, and an electric potential of each of bit lines BL connected thereto is set to a floating state or the ground electric potential (0V). As described above, one selective transistor 22 in the drive-target memory cell 20 is turned into on-state, the drive-target memory element 21 is selected, and thereby, the writing operation or the reading operation is performed.

A description will be given below of the writing operation. As described above, each of the memory cells 20 has one memory element 21 configured of a transistor and one selective transistor 22. In each of the memory cells 20, one word line WL is connected to the gate of one selective transistor 22. One bit line BL is connected to one of the source and the drain of one selective transistor 22, and one of the source and the drain of one memory element 21 is connected to the other one of the source and the drain of one selective transistor 22. Further, the other one of the source and the drain of one memory element 21 is connected to the ground GND, and the gate is connected to a gate line GL to which a predetermined gate voltage Vg is applied.

Upon the operation of writing into the memory element 21, first, a voltage equal to or larger than a predetermined threshold voltage Vth is applied to the respective gates of the memory element 21 and the selective transistor 22, and both of which are turned into on-state (the gate voltage Vg of the memory element 21>Vth). Next, a voltage not larger than respective withstand voltages of the memory element 21 and the selective transistor 22 is applied to the bit line BL, and a state in which currents respectively flow to the memory element 21 and the selective transistor 22 is set. Subsequently, the gate voltage Vg of the memory element 21 is decreased (for example, Vg=electric potential of the ground GND), and the memory element 21 is set to snapback mode. Thereby, as described above, a large current flows between the source and the drain of the memory element 21, and PN junction is destroyed. As a result, the source and the drain are short-circuited. That is, in the memory element 21, as in a general anti-fuse-type OTP element, open state between both the electrodes (the source and the drain) is changed to short-circuit state therebetween, and thereby, the information writing operation is performed.

Figure 6A:
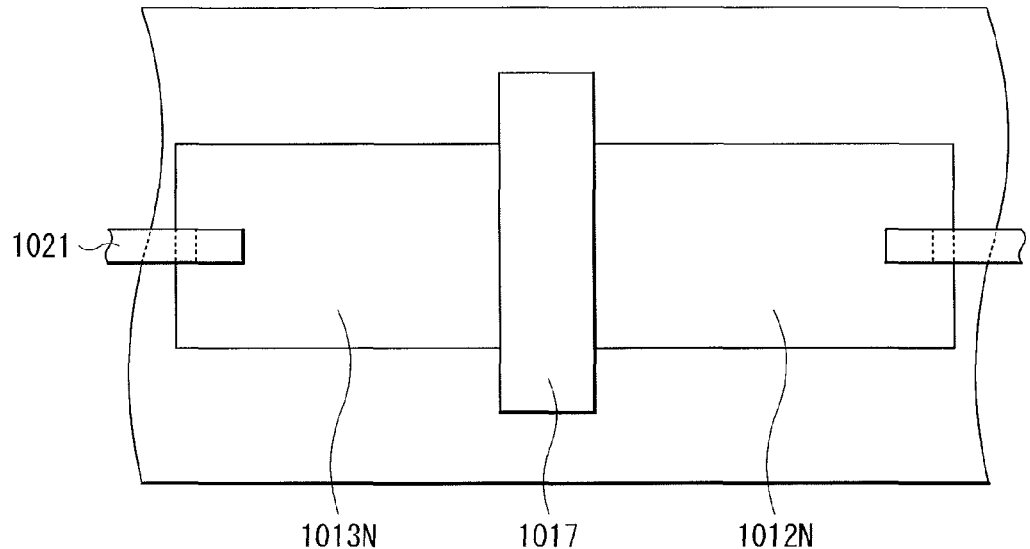
FIG. 6A is a plan view illustrating a configuration of a memory element as a comparative example.
Figure 6B:
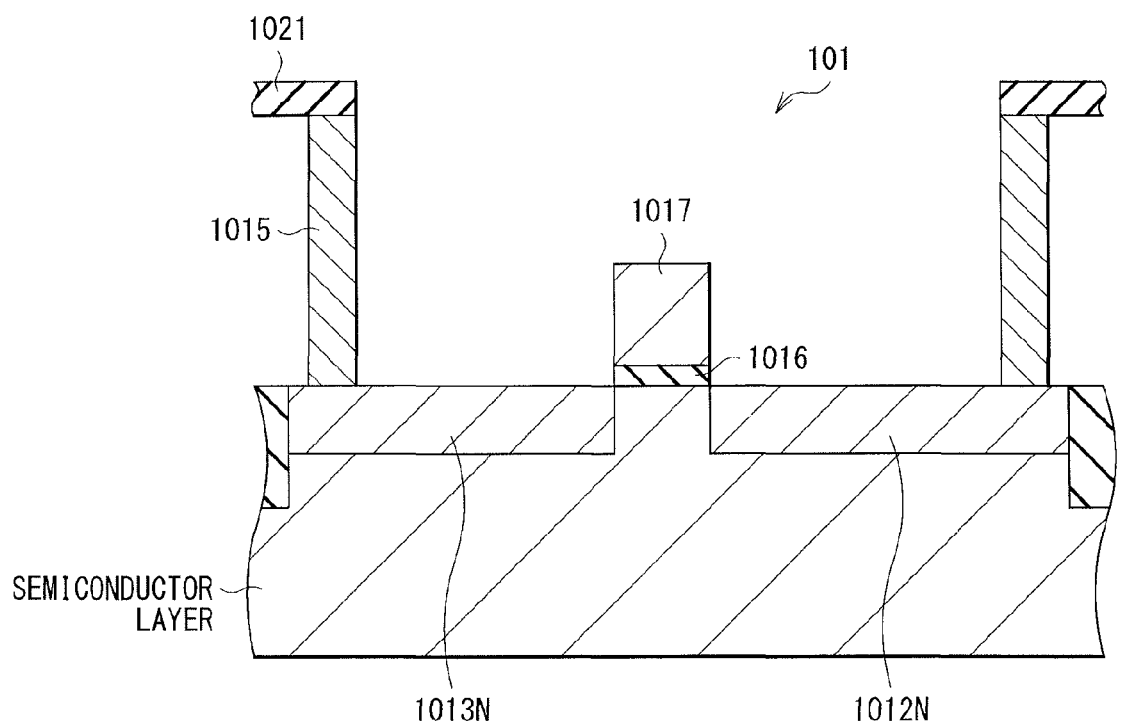
FIG. 6B is a cross-sectional view of the memory element illustrated in FIG. 6A.

FIG. 6A and FIG. 6B respectively illustrate a planar configuration and a cross-sectional configuration of a general memory element 101. Upon the foregoing writing operation, by applying a high voltage between a gate (an electrically-conductive film 1017) and, for example, a drain (a semiconductor layer 1013N), insulation breakdown occurs in part or all of a dielectric film 1016 (part of a region on the semiconductor layer 1013N side, for example), and thereby, a current flows between the electrically-conductive film 1017 and the semiconductor layer 1013N. As a result, a filament (not illustrated) as an electrically-conductive path that electrically connects a semiconductor layer 1012N and the semiconductor layer 1013N is formed between the semiconductor layers 1012N and 1013N. However, at the same time, a contact section 1015 and a wiring layer 1021 may burn out due to high heat generated at the time of applying the voltage.

In contrast, in the memory element 21 and the method of manufacturing the memory element 21 according to this embodiment, the semiconductor layer 213N corresponding to a drain electrode is divided into the heat confinement region 213A and the connection region 213B, and the insulating film 214A is arranged between the heat confinement region 213A and the connection region 213B. Further, the electrically-conductive film 218 is provided on the insulating film 214A, and thereby, the heat confinement region 213A and the connection region 213B are electrically connected. Thereby, at the time of writing, heat generated between the electrical conductor 217 and the heat confinement region 213A is prevented from being dispersed, and heat conduction to the connection region 213B is suppressed.

As described above, in this embodiment, the semiconductor layer 213N is divided into the heat confinement region 213A and the connection region 213B, and a voltage is applied between the heat confinement region 213A and the electrically-conductive film 217. Further, in the connection region 213B, the contact section 215B that connects the connection region 213B to the wiring layer 221 is formed. Thereby, heat generated upon applying a voltage to the heat confinement region 213A and the electrically-conductive film 217 is allowed to be confined in the heat confinement region 213A, and burnout in the joint section between the wiring layer 221 and the contact section 215B connecting thereto is allowed to be prevented without increasing the area of the semiconductor layer 213N. That is, the area of the memory element 21 is allowed to be reduced.

It is to be noted that the memory element 21 according to this embodiment is a gate stress-type OTP element, in which high heat generated by applying a high voltage may affect only an electrode to which the voltage is applied, in this case, only the connection section (the contact section 215B) of the semiconductor layer 213N. Specifically, such high heat may cause burnout only in the electrode to which the voltage is applied, in this case, only in the connection section (the contact section 215B) of the semiconductor layer 213N. Therefore, the area, the shape, and the like on the semiconductor layer 212N side not affected by the burnout and the like are not particularly limited.

A description will be given below of second and third embodiments and Modifications 1 to 3. It is to be noted that for components same as the components of the first embodiment, the same referential symbols are affixed thereto, and descriptions thereof will be omitted.

2. Second Embodiment

Figure 7A:
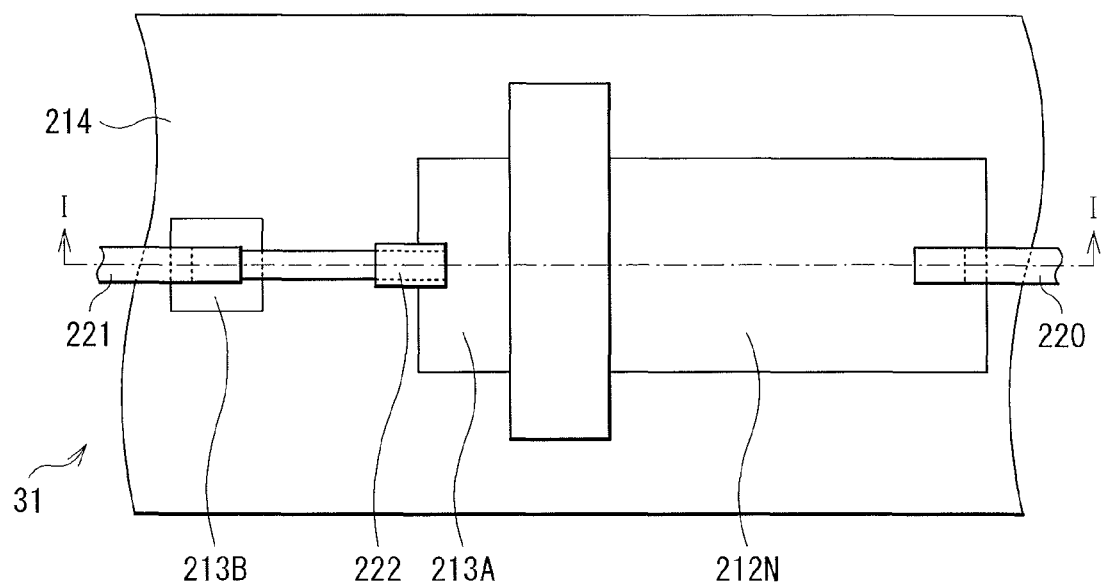
FIG. 7A is a plan view illustrating a configuration of a memory element according to a second embodiment of the present disclosure.
Figure 7B:
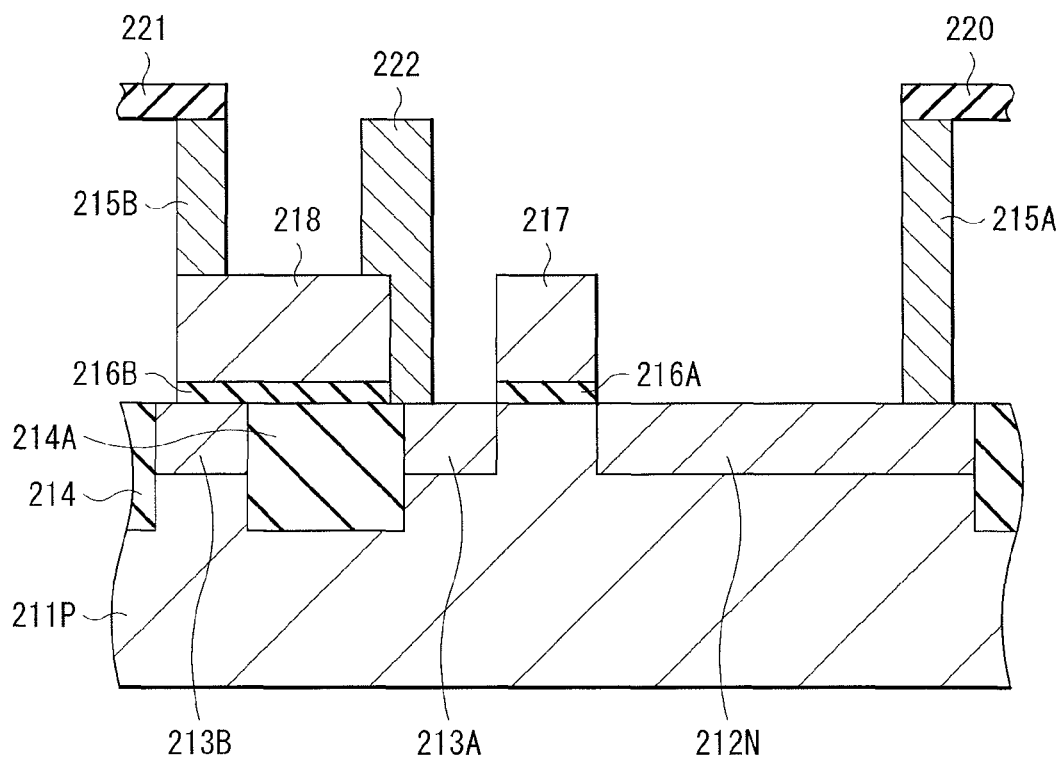
FIG. 7B is a cross-sectional view of the memory element illustrated in FIG. 7A.

FIG. 7A illustrates a planar configuration of a memory element 31 configuring a memory device 1 according to the second embodiment of the present disclosure. FIG. 7B illustrates a configuration of a cross-section taken along a line I-I of the memory element 31 illustrated in FIG. 7A. The memory element 31 is different from the foregoing first embodiment in that the heat confinement region 213A and the connection region 213B are electrically connected with the use of a shared contact 222. It is to be noted that, in this example, the dielectric film 216 is formed in a region under the electrically-conductive film 218 as in the case of the dielectric film 216 formed in the region under the electrically-conductive film 217, and the heat confinement region 213A is electrically connected to the wiring layer 221 without through the connection region 213B. Specifically, the heat confinement region 213A is connected to the contact section 215B through the shared contact 222 and the electrically-conductive film 218.

The shared contact 222 is made of a material same as the material of the foregoing contact sections 215A and 215B, and is formed in steps same as the steps thereof. For example, the shared contact 222 may be formed to cover part of the heat confinement region 213A, a side surface of the electrically-conductive film 218, and part of the top surface of the electrically-conductive film 218.

A specific method of forming the shared contact 222 will be described below. First, as in the foregoing first embodiment, the whole surface of the semiconductor layer 211P in which the semiconductor layers 212N and 213N and the insulating film 214A are provided is coated with a dielectric. Subsequently, an electrical conductor is formed on the dielectric film by sputtering and/or the like. Thereafter, portions of the electrically-conducive film and the dielectric film in predetermined positions such as positions on the heat confinement region 213A and on the semiconductor layer 212N are removed by etching, and thereby, the dielectric films 216A and 216B and the electrically-conducive films 217 and 218 are formed. Next, after applying the insulating layer, hole opening by etching and metal filling by sputtering or burying are performed, and thereby, the contact sections 215A and 215B and the shared contact 222 are formed. In subsequent steps, the wiring layers 220 and 221 are formed by a method similar to that of the first embodiment, and thereby, the memory device 1 illustrated in FIG. 7A and FIG. 7B is completed.

As described above, in this embodiment, the heat confinement region 213A and the connection region 213B are electrically connected with the use of the shared contact 222. Therefore, the step of removing the dielectric film in the region where the electrically-conductive film 218 connecting the heat confinement region 213A and the connection region 213B is formed is omitted. That is, compared to in the first embodiment, the number of manufacturing steps is allowed to be decreased.

It is to be noted that, as described above, the heat confinement region 213A is directly and electrically connected to the contact section 215B not through the connection region 213B but thorough the shared contact 222 and the electrically-conductive film 218. Therefore, the connection region 213B of the semiconductor 213N may be omitted.

3. Third Embodiment

Figure 8A:
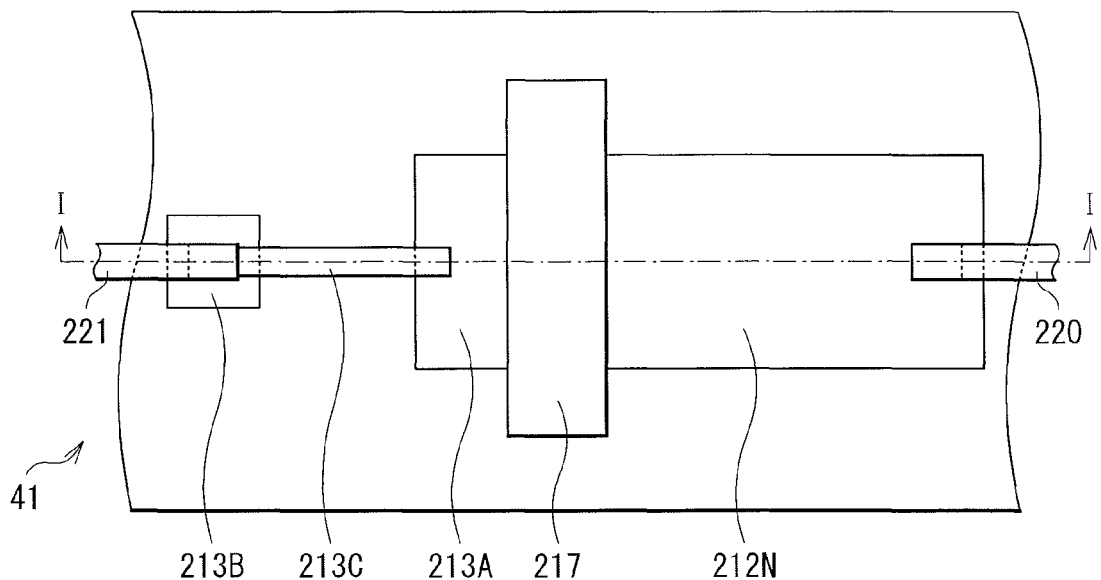
FIG. 8A is a plan view illustrating a configuration of a memory element according to a third embodiment of the present disclosure.
Figure 8B:
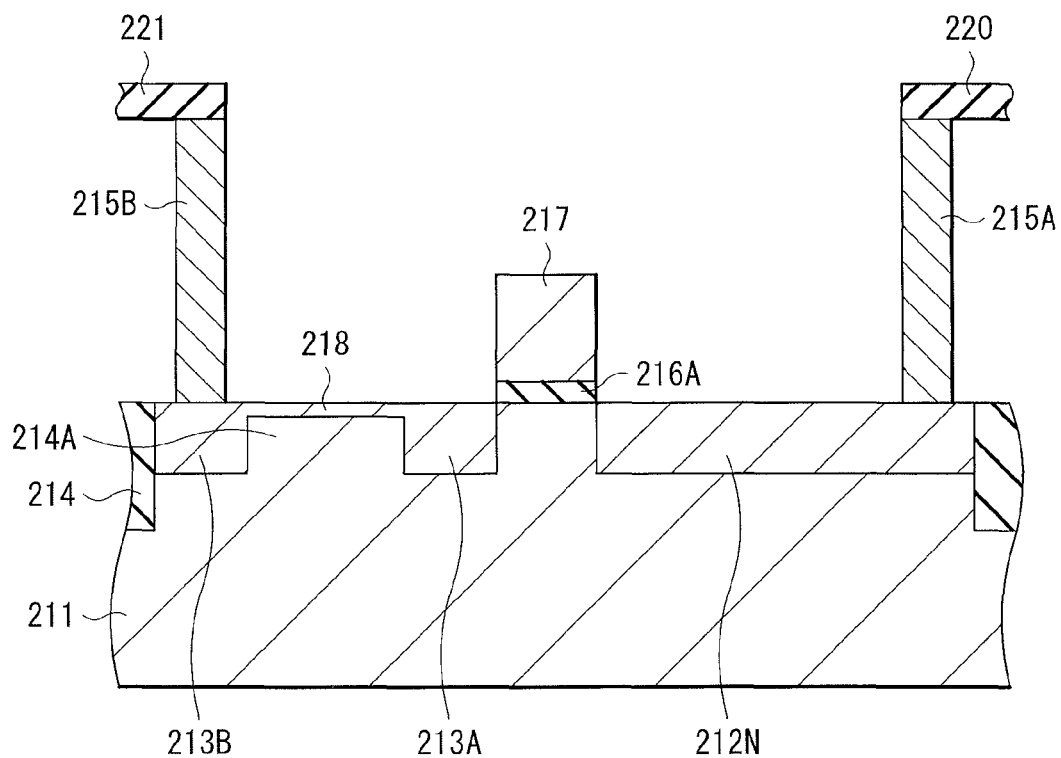
FIG. 8B is a cross-sectional view of the memory element illustrated in FIG. 8A.

FIG. 8A illustrates a planar configuration of a memory element 41 configuring a memory device 1 according to the third embodiment of the present disclosure. FIG. 8B illustrates a configuration of a cross-section taken along a line I-I of the memory element 41 illustrated in FIG. 8A. The memory element 41 is different from the foregoing first and second embodiments in that a region having a small width is formed between the heat confinement region 213A and the connection region 213B of the semiconductor layer 213N, and such a region is configured to serve as a bridge section (a bridge structure 213C) that electrically connects the heat confinement region 213A and the connection region 213B.

As described above, the bridge structure 213C is the semiconductor layer 213N having a small width located between the heat confinement region 213A and the connection region 213B. It is to be noted that, in order to suppress conduction of heat from the heat confinement region 213A to the connection region 213B, the thickness of the bridge structure 213C may be preferably thin as illustrated in FIG. 8B. However, the thickness thereof may remain the same as the thickness of the semiconductor layer 213N. By reducing the area of the semiconductor layer 213N, heat conduction is allowed to be sufficiently decreased. Further, it may be preferable that the element separation film 214 does not exist below the bridge structure 213C.

As described above, in this embodiment, the bridge structure 213C is formed in the insulating film 214A that separates the heat confinement region 213A from the connection region 213B. Therefore, the heat confinement region 213A and the connection region 213B are electrically connected without forming an external connection structure such as the electrically-conductive film 218 and the shared contact 222 formed in the foregoing embodiments. Thereby, the structure of the memory element 41 is allowed to be simplified without an additional step.

4. Modifications

A description will be given below of Modifications 1 to 3 of the foregoing first to third embodiments. Each of memory elements 51, 61, and 71 configuring the memory device 1 of Modifications 1 to 3 is a source-drain-type OTP element. The source-drain-type OTP element may operate based on the following principle. First, for example, the semiconductor layer 211P of the memory element 51 is set to GND, a positive voltage is applied to the semiconductor layer 213A out of the semiconductor layers 213A and 213B as the heat confinement region, and a negative voltage is applied to a heat confinement region 212A. Accordingly, a voltage is applied to an interface between the semiconductor layer 213A and the semiconductor layer 211P. In the case where such a voltage exceeds a backward breakdown voltage, a current rapidly flows. Such a current flows between 212A and 213A having a large electric potential difference, and therefore, a large current flows between the drain and the source, and heat is generated. Due to migration by the heat generation, one or both of conductor components configuring the semiconductor layer 213A (electrode) and a contact section 218A and a conductor component configuring the contact section 215B are moved into the semiconductor layer 211P. As a result, the filament 210 is formed.

Modification 1

Figure 9A:
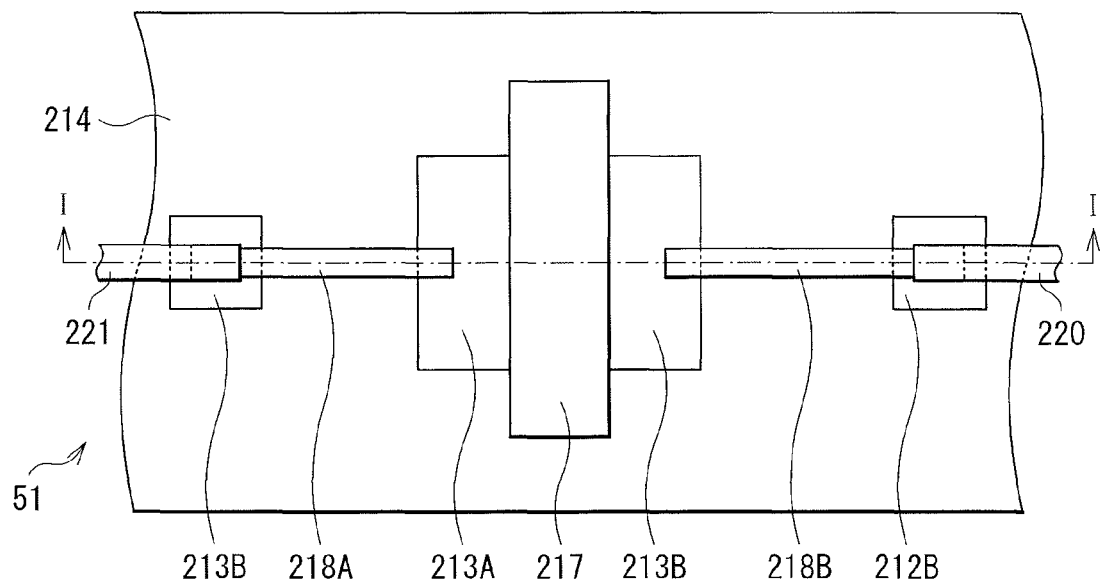
FIG. 9A is a plan view illustrating a configuration of a memory element according to Modification 1 of the first embodiment.
Figure 9B:
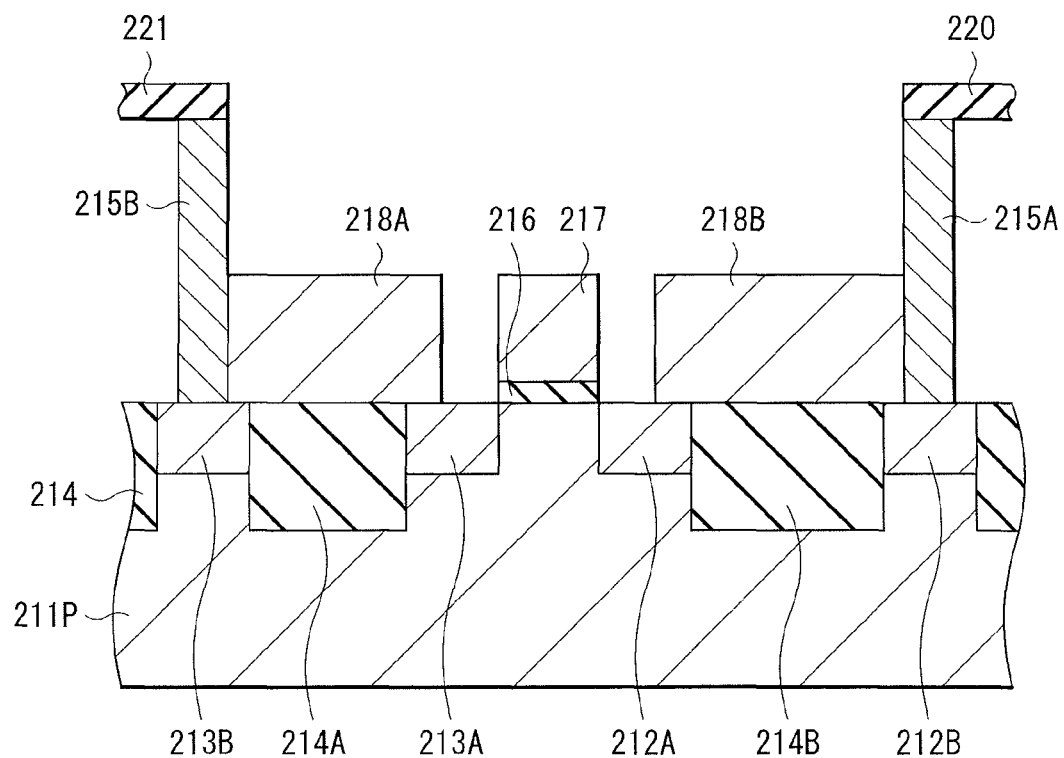
FIG. 9B is a cross-sectional view of the memory element illustrated in FIG. 9A.

FIG. 9A illustrates a planar configuration of a memory element 51 according to a modification of the foregoing first embodiment. FIG. 9B illustrates a configuration of a cross-section taken along a line I-I of the memory element 51 illustrated in FIG. 9A. In the memory element 51, as described above, a structure similar to that of the semiconductor layer 213N in the first embodiment is applied to the semiconductor layer 212N. Specifically, the semiconductor layer 212N is divided into the heat confinement region 212A (semiconductor layer 212A) and a connection region 212B that are separated with an insulating film 214B in between. The heat confinement region 212A and the connection region 212B are electrically connected by an electrically-conductive film 218B. It is to be noted that the size and the shape of the heat confinement region 212A are not necessarily the same as the size and the shape of the heat confinement region 213A, and the heat confinement regions 212A and 213A may be independently designed. The same is similarly applied to the connection regions 212B and 213B.

Modification 2

Figure 10A:
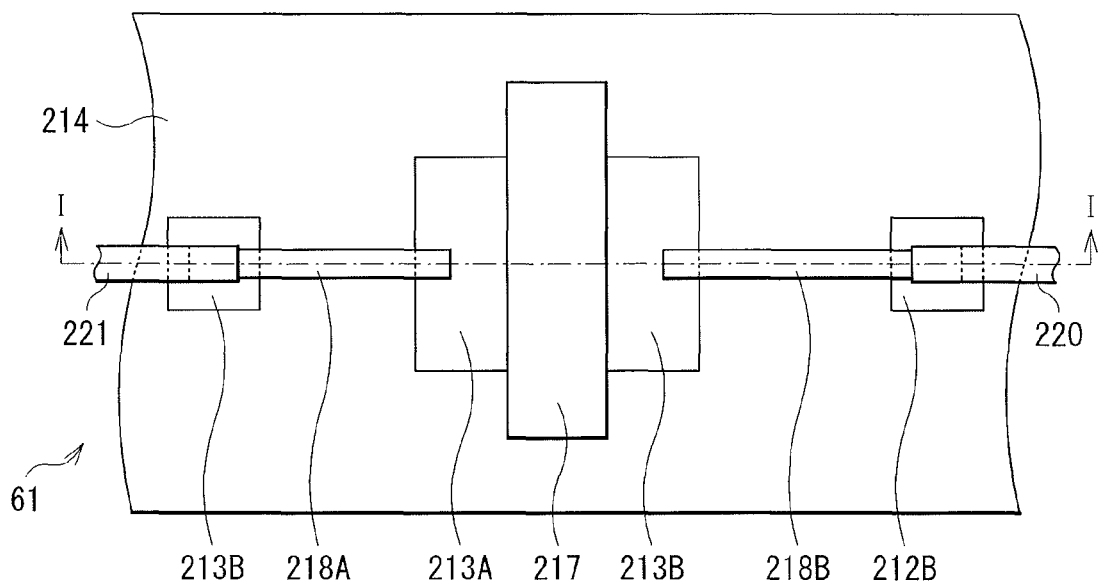
FIG. 10A is a plan view illustrating a configuration of a memory element according to Modification 2 of the second embodiment.
Figure 10B:
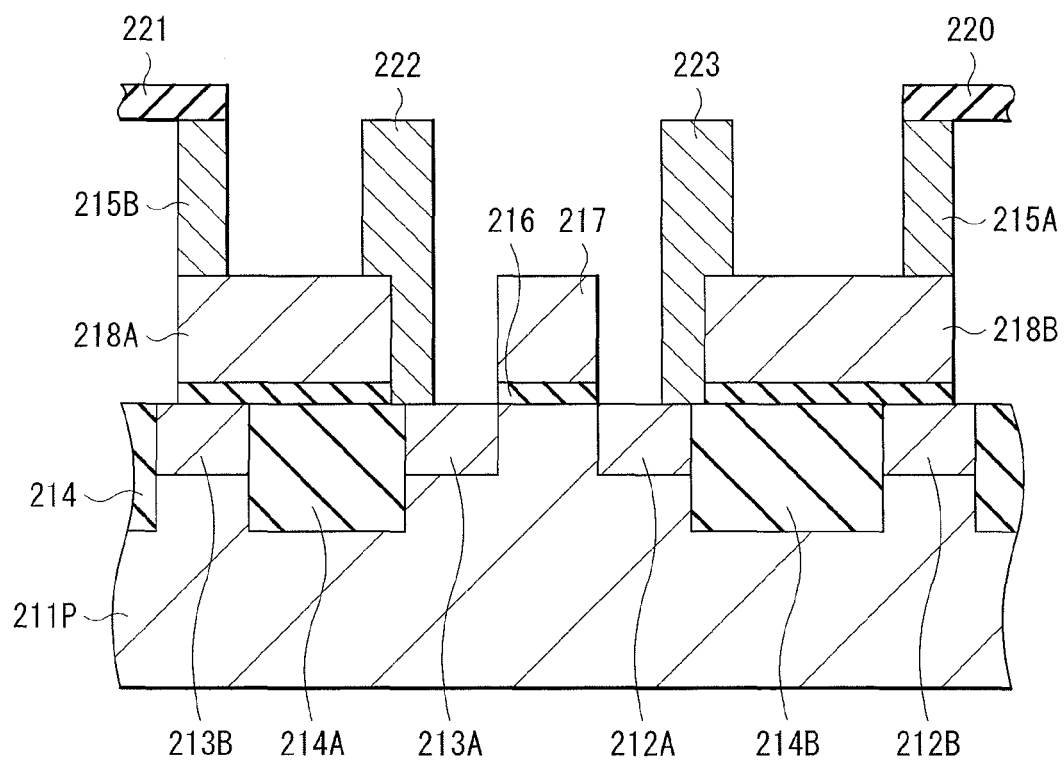
FIG. 10B is a cross-sectional view of the memory element illustrated in FIG. 10A.

FIG. 10A illustrates a planar configuration of a memory element 61 according to a modification of the foregoing second embodiment. FIG. 10B illustrates a configuration of a cross-section taken along a line I-I of the memory element 61 illustrated in FIG. 10A. In the memory element 61, a structure similar to that of the semiconductor layer 213N in the second embodiment is applied to the semiconductor layer 212N. Specifically, the heat confinement region 212A and the connection region 212B are electrically connected with the use of a shared contact 223.

Modification 3

Figure 11A:
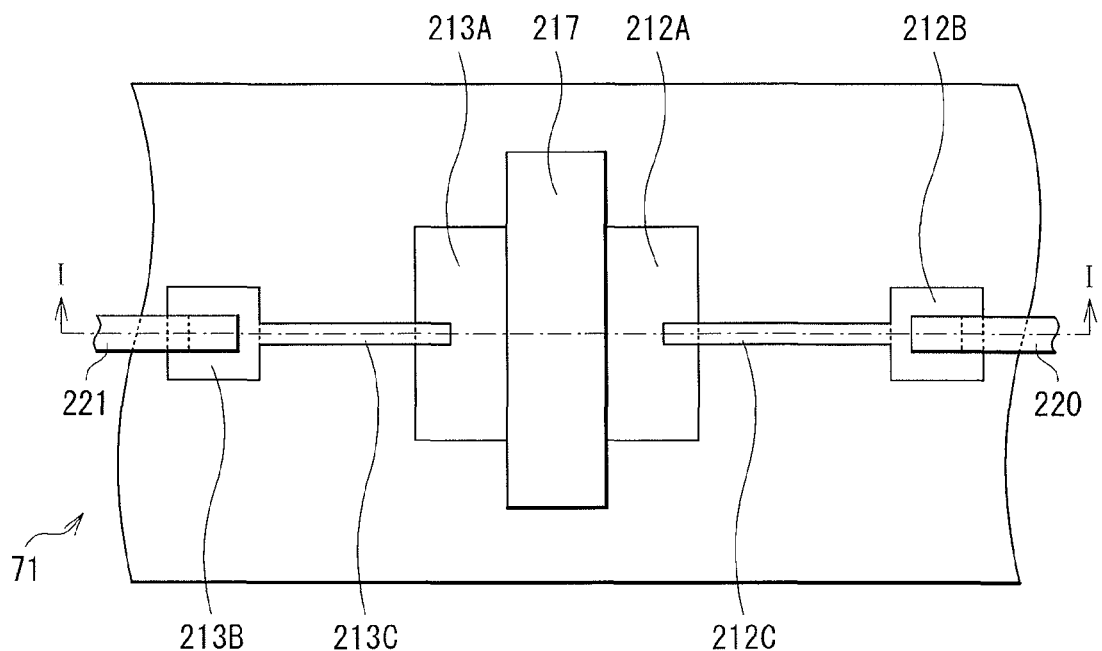
FIG. 11A is a plan view illustrating a configuration of a memory element according to Modification 3 of the third embodiment.
Figure 11B:
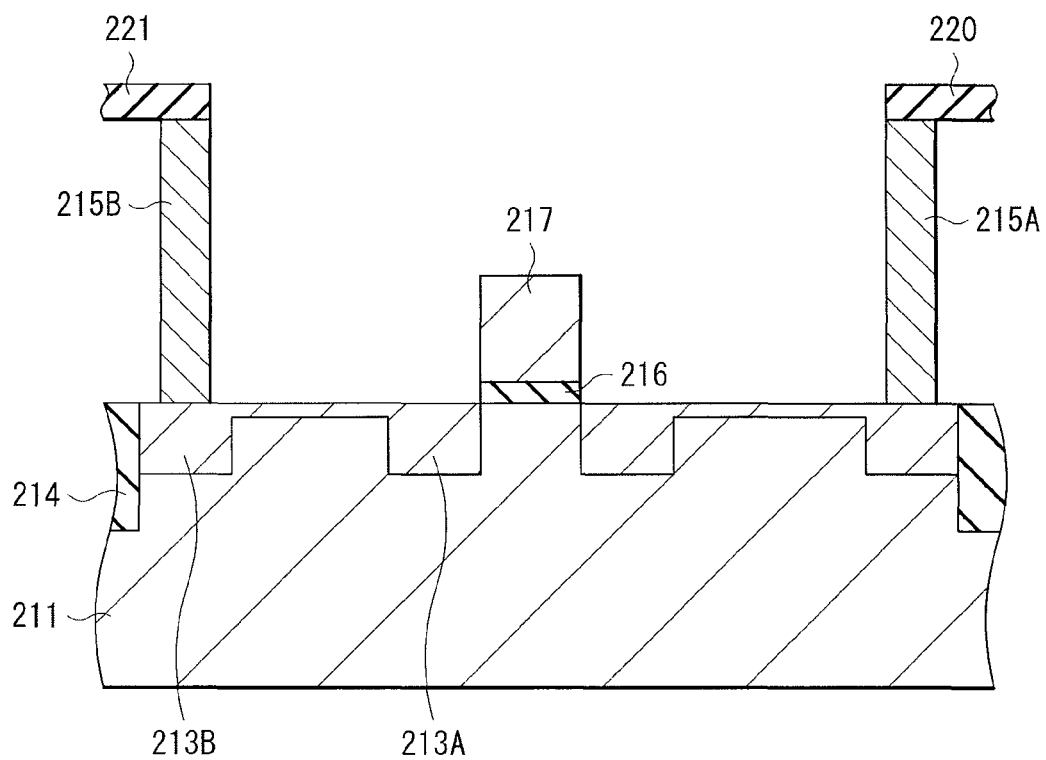
FIG. 11B is a cross-sectional view of the memory element illustrated in FIG. 11A.

FIG. 11A illustrates a planar configuration of a memory element 71 according to a modification of the foregoing third embodiment. FIG. 11B illustrates a configuration of a cross-section taken along a line I-I of the memory element 71 illustrated in FIG. 11A. In the memory element 71, a structure similar to that of the semiconductor layer 213N in the third embodiment is applied to the semiconductor layer 212N. Specifically, the heat confinement region 212A and the connection region 212B are electrically connected by forming a bridge structure 212C obtained by thinning the semiconductor layer 212N in a groove provided in the semiconductor layer 211.

Other Modifications

The present technology has been described with reference to the first to the third embodiments and Modifications 1 to 3. However, the present technology is not limited to the embodiments and the like, and various modifications may be made.

For example, materials of the respective layers are not limited to the materials described in the foregoing embodiments and the like, and other materials may be used. Further, in the foregoing embodiments, the description has been given with specific examples of the configurations of the memory element, the memory cell, the memory device, and the like. However, all layers are not necessarily included, and other layers may be further included.

Further, in the foregoing embodiments and the like, the description has been given of the case in which the selective transistor 22 on the bit line BL side and the memory element 21 on the ground GND side are connected in series between the bit line BL and the ground GND. However, the circuit configuration of the memory cell is not limited thereto. That is, on the contrary, the selective transistor 22 on the ground GND side and the memory element 21 on the bit line BL side may be connected in series.

Further, in the foregoing embodiments and the like, the description has been given of the case in which the semiconductor layer 211P is a P-type semiconductor layer, and each of the semiconductor layers 212N, 213N, 222N, and 223N is an N-type semiconductor layer. However, the electric conductivity types (P-type and N-type) of these semiconductor layers may be opposite to the foregoing types.

In addition thereto, in the foregoing embodiments and the like, the description has been given of the case in which the plurality of memory elements are provided in the memory device. However, the configuration is not limited thereto, and only one memory element may be provided in the memory device.

Further, in the foregoing embodiments and the like, the description has been given of the memory device as an example of semiconductor devices of the present technology. However, a semiconductor device may be configured of a semiconductor integrated circuit including other elements (such as a transistor, a capacitive element, and a resistance element) in addition to the foregoing memory device.

It is possible to achieve at least the following configurations from the above-described example embodiments and the modifications of the disclosure.

(1) A semiconductor device, including:
a first semiconductor layer having a first conductivity type;
a pair of first electrodes arranged to be separated from each other in the first semiconductor layer;
a second electrode provided on the first semiconductor layer between the pair of first electrodes with a dielectric film in between; and
a pair of connection sections electrically connected to the pair of first electrodes, wherein
one or both of the pair of first electrodes are divided into a first region and a second region, the first region and the second region being connected by a bridge section.

(2) The semiconductor device according to (1), wherein the first region and the second region are separated by an insulating film.

(3) The semiconductor device according to (2), wherein the bridge section is a second conducive film provided on the insulating film.

(4) The semiconductor device according to (2), wherein the bridge section is a bridge structure provided in the insulating film.

(5) The semiconductor device according to any one of (1) to (4), wherein the pair of first electrodes is formed of a second conductive-type semiconductor.
(6) A method of manufacturing a semiconductor device, the method including:
    forming a pair of first electrodes in a first semiconductor layer having first conductive-type, one or both of the pair of first electrodes being divided into a first region and a second region;
    forming a dielectric film on the first semiconductor layer between the pair of first electrodes;
    forming a second electrode arranged on the dielectric film;
    forming a bride section electrically connecting the first region and the second region; and
    forming a pair of connection sections connected to the pair of first electrodes.

It should be understood by those skilled in the art that various modifications, combinations, sub-combinations and alternations may occur depending on design requirements and other factors insofar as they are within the scope of the appended claims or the equivalents thereof.

What is claimed is:

1. A semiconductor device, comprising:
   a first semiconductor layer having a first conductivity type;
   a pair of first electrodes arranged to be separated from each other in the first semiconductor layer;
   a second electrode provided on the first semiconductor layer between the pair of first electrodes with a dielectric film in between; and
   a pair of connection sections electrically connected to the pair of first electrodes, wherein one or both of the pair of first electrodes are divided into a first region and a second region, the first region and the second region being connected to each other by a bridge section.

2. The semiconductor device according to claim 1, wherein the first region and the second region are separated by an insulating film.

3. The semiconductor device according to claim 2, wherein the bridge section is a second conductive film provided on the insulating film.

4. The semiconductor device according to claim 2, wherein the bridge section is a bridge structure provided in the insulating film.

5. The semiconductor device according to claim 1, wherein the pair of first electrodes is formed of a second conductive-type semiconductor.

6. A method of manufacturing a semiconductor device, the method comprising:
    forming a pair of first electrodes in a first semiconductor layer having first conductive-type, one or both of the pair of first electrodes being divided into a first region and a second region;
    forming a dielectric film on the first semiconductor layer between the pair of first electrodes;
    forming a second electrode arranged on the dielectric film;
    forming a bridge section electrically connecting the first region and the second region to each other; and
    forming a pair of connection sections connected to the pair of first electrodes.

7. The semiconductor device according to claim 1, wherein the bridge section has a width smaller than the first region and the second region.

8. The semiconductor device according to claim 1, wherein the dielectric film is formed on the first semiconductor layer between the pair of first electrodes.

9. The semiconductor device according to claim 1, wherein a conductive film is formed below the dielectric film in the first semiconductor layer to connect the pair of first electrodes.

* * * * *